United States Patent
Yang (10) Patent No.: US 11,005,480 B1
(45) Date of Patent: May 11, 2021

(54) PHASE LOCKED LOOP DEVICE AND CLOCK GENERATION METHOD

(71) Applicant: REALTEK SEMICONDUCTOR CORPORATION, Hsinchu (TW)

(72) Inventor: Yu-Che Yang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/140,167

(22) Filed: Jan. 4, 2021

(30) Foreign Application Priority Data

Apr. 16, 2020 (TW) .................................. 109112860

(51) Int. Cl.
| | |
|---|---|
| *H03L 7/085* | (2006.01) |
| *H03L 7/099* | (2006.01) |
| *H03L 7/081* | (2006.01) |
| *G04F 10/00* | (2006.01) |
| *H03L 7/08* | (2006.01) |

(52) U.S. Cl.
CPC ............ *H03L 7/085* (2013.01); *G04F 10/005* (2013.01); *H03L 7/081* (2013.01); *H03L 7/0802* (2013.01); *H03L 7/099* (2013.01); *H03L 2207/50* (2013.01)

(58) Field of Classification Search
CPC ....... H03L 7/085; H03L 7/0802; H03L 7/081; H03L 7/099; G04F 10/005
USPC .................................. 327/147–149, 156–158
See application file for complete search history.

(56) References Cited

U.S. PATENT DOCUMENTS

| | | | | |
|---|---|---|---|---|
| 7,778,610 | B2* | 8/2010 | Staszewski | H03B 21/00 455/76 |
| 7,809,338 | B2* | 10/2010 | Tsfati | H03K 5/00006 455/76 |
| 8,593,189 | B1* | 11/2013 | Yen | H03M 1/50 327/156 |
| 8,704,567 | B2* | 4/2014 | Ainspan | H03L 7/1072 327/158 |
| 9,673,835 | B1* | 6/2017 | Kinyua | H03M 1/145 |
| 10,651,876 | B1* | 5/2020 | Perez | H04B 1/04 |

(Continued)

OTHER PUBLICATIONS

R. B. Staszewski et al., "All-digital PLL and transmitter for mobile phones," in IEEE Journal of Solid-State Circuits, vol. 40, No. 12, pp. 2469-2482, Dec. 2005, doi: 10.1109/JSSC.2005.857417.

(Continued)

*Primary Examiner* — Adam D Houston
(74) *Attorney, Agent, or Firm* — WPAT, PC (57) ABSTRACT

A phase locked device includes a digital controlled oscillator circuit, a clock signal generator circuitry, a time to digital converter circuit, and a logic control circuit. The digital controlled oscillator circuit is configured to generate a first clock signal in response to a plurality of digital codes. The clock signal generator circuitry is configured to generate a plurality of second clock signals according to the first clock signal, and to select a third clock signal and a fourth clock signal from the plurality of second clock signals according to a selection signal, in order to generate an output signal. The time to digital converter circuit is configured to detect a delay difference between the output signal and a reference signal, in order to generate the plurality of digital codes. The logic control circuit is configured to generate the selection signal according to the plurality of digital codes.

17 Claims, 5 Drawing Sheets

(56) References Cited

U.S. PATENT DOCUMENTS

| | | | |
|---|---|---|---|
| 2006/0033582 A1* | 2/2006 | Staszewski | H03L 7/085 331/16 |
| 2007/0085623 A1* | 4/2007 | Staszewski | H03L 7/085 331/182 |
| 2008/0002788 A1* | 1/2008 | Akhtar | H04L 27/361 375/298 |
| 2008/0069286 A1* | 3/2008 | Staszewski | H03L 7/1806 375/376 |
| 2008/0315928 A1* | 12/2008 | Waheed | H03L 7/0991 327/159 |
| 2009/0070568 A1* | 3/2009 | Shi | G06F 9/3875 712/237 |
| 2009/0201065 A1* | 8/2009 | Kuwano | H03L 7/099 327/299 |
| 2009/0262877 A1* | 10/2009 | Shi | H03L 1/022 375/376 |
| 2010/0073047 A1* | 3/2010 | Best | H03L 7/0814 327/156 |
| 2010/0156485 A1* | 6/2010 | Madoglio | H03L 7/08 327/158 |
| 2011/0007859 A1* | 1/2011 | Ueda | H03L 7/18 375/376 |
| 2011/0140746 A1* | 6/2011 | Park | H03L 7/099 327/156 |
| 2011/0292973 A1* | 12/2011 | Kianush | H03L 7/099 375/147 |
| 2012/0049914 A1* | 3/2012 | Pellerano | H03L 7/1974 327/158 |
| 2012/0062296 A1* | 3/2012 | Miyashita | H03L 7/085 327/159 |
| 2012/0208483 A1* | 8/2012 | Otaka | H04W 52/0229 455/337 |
| 2012/0250811 A1* | 10/2012 | Misek | H03L 7/0807 375/371 |
| 2013/0093471 A1* | 4/2013 | Cho | H03L 7/16 327/107 |
| 2014/0320324 A1* | 10/2014 | Canard | H03M 1/201 341/131 |
| 2015/0014517 A1* | 1/2015 | Ikebe | G04F 10/005 250/208.1 |
| 2015/0015308 A1* | 1/2015 | Da Dalt | H03L 7/081 327/106 |
| 2015/0214960 A1 | 7/2015 | Kim et al. | |
| 2016/0308541 A1* | 10/2016 | Liu | H03L 7/089 |
| 2017/0063387 A1* | 3/2017 | Gao | H03B 5/1228 |
| 2017/0170920 A1* | 6/2017 | Kuo | H04L 7/0087 |
| 2017/0264304 A1* | 9/2017 | Dedic | H03L 7/091 |
| 2018/0343011 A1* | 11/2018 | Tajalli | H03L 7/0816 |
| 2020/0083893 A1* | 3/2020 | Konradsson | H03B 5/1212 |
| 2020/0195255 A1* | 6/2020 | Fan | H03L 7/0895 |
| 2020/0295765 A1* | 9/2020 | Agrawal | H03L 7/091 |
| 2020/0295769 A1* | 9/2020 | Hermoso | H03L 7/099 |

OTHER PUBLICATIONS

Y. Liu et al., "An Ultra-Low Power 1.7-2.7 GHz Fractional-N Sub-Sampling Digital Frequency Synthesizer and Modulator for IoT Applications in 40 nm CMOS," in IEEE Transactions on Circuits and Systems I: Regular Papers, vol. 64, No. 5, pp. 1094-1105, May 2017, doi: 10.1109/TCSI.2016.2625462.

OA letter of the counterpart TW application (appl. No. 109112860 ) mailed on Oct. 30, 2020. Summary of the OA letter: 1. Claims 1-2, 4-5, 7-8, and 10 are rejected as allegedly being anticipated by the cited reference 1 (US 2015/0214960 A1). 2. Claim 3 is rejected as allegdly being unpatentable over the cited reference 1. 3. Claims 6 and 9 are allowable.

* cited by examiner

PHASE LOCKED LOOP DEVICE AND CLOCK GENERATION METHOD

BACKGROUND OF THE INVENTION

1. Field of the Invention

The present disclosure relates to a phase locked device. More particularly, the present disclosure relates to an all digital phase locked device and a clock generation method thereof.

2. Description of Related Art

In recent years, on account of the better reconfiguration ability, easiness of transplanting the technology, self-calibration ability, and so on, an analog phase locked loop is gradually replaced by an all-digital phase locked loop. In some related approaches, a time to digital converter circuit is utilized to analyze a phase error of the all digital phase locked loop. In these approaches, in order to lock the phase correctly, a delay time of the time to digital converter circuit is required to cover at least half of period of a signal generated from a digital controlled oscillator. As a result, hardware cost and power consumption are significantly increased.

SUMMARY OF THE INVENTION

In some embodiments, a phase locked device includes a digital controlled oscillator circuit, a clock signal generator circuitry, a time to digital converter circuit, and a logic control circuit. The digital controlled oscillator circuit is configured to generate a first clock signal in response to a plurality of digital codes. The clock signal generator circuitry is configured to generate a plurality of second clock signals according to the first clock signal, and to select a third clock signal and a fourth clock signal from the plurality of second clock signals according to a selection signal, in order to generate an output signal. The time to digital converter circuit is configured to detect a delay difference between the output signal and a reference signal, in order to generate the plurality of digital codes. The logic control circuit is configured to generate the selection signal according to the plurality of digital codes.

In some embodiments, a clock generation method includes the following operations: generating a first clock signal in response to a plurality of digital codes; generating a plurality of second clock signals according to the first clock signal; selecting a third clock signal and a fourth clock signal from the plurality of second clock signals according to a selection signal, in order to generate an output signal; detecting a delay difference between the output signal and a reference signal, in order to generate the plurality of digital codes; and generating the selection signal according to the plurality of digital codes.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
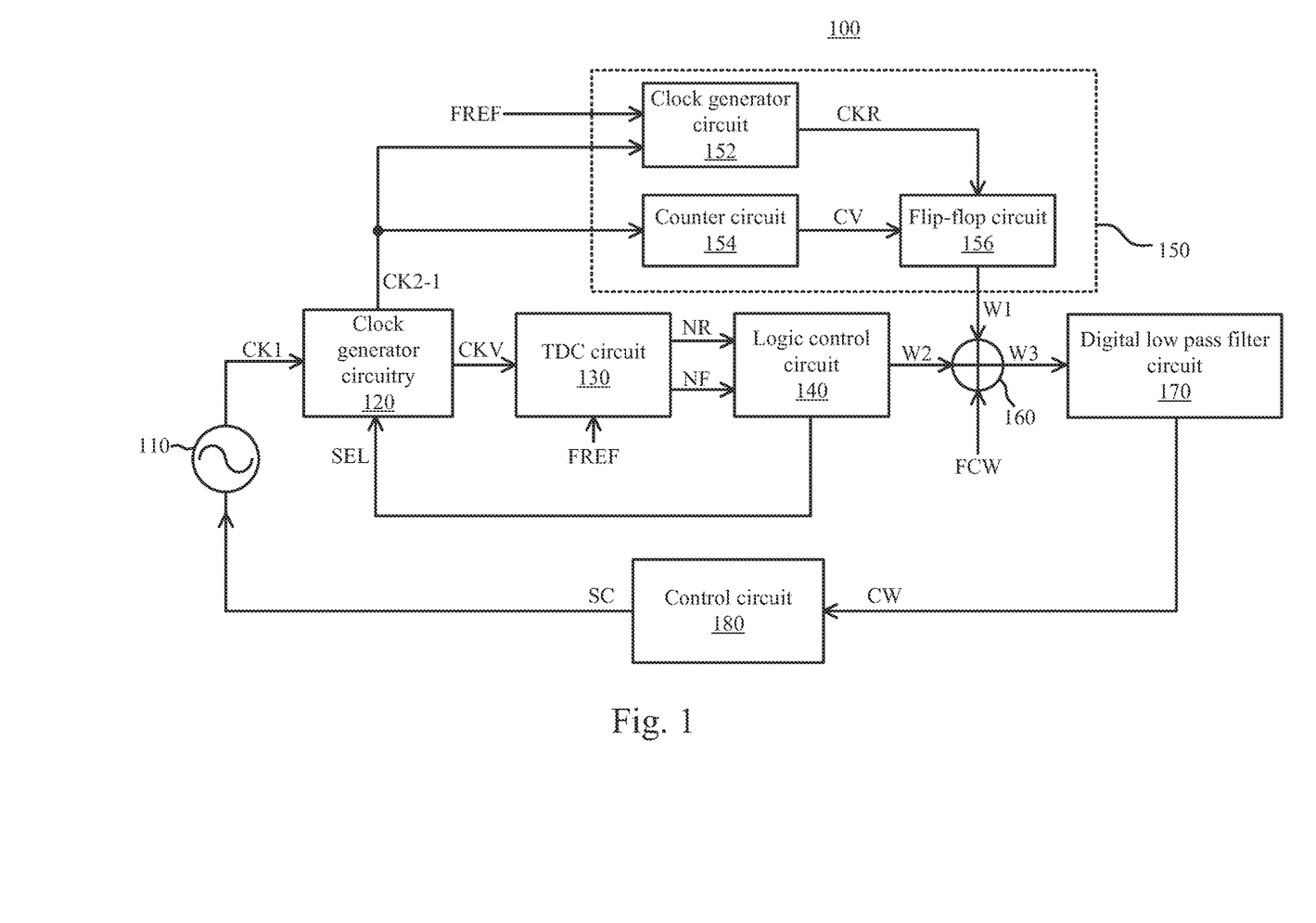
FIG. 1 is a schematic diagram of a phase locked loop device according to some embodiments of the present disclosure.

FIG. 1 is a schematic diagram of a phase locked loop device 100 according to some embodiments of the present disclosure. In some embodiments, the phase locked loop device 100 may be an all digital phase locked loop. The phase locked loop device 100 includes a digital controlled oscillator circuit 110, a clock generator circuitry 120, a time to digital converter (TDC) circuit 130, a logic control circuit 140, a frequency tracking circuitry 150, an adder circuit 160, a digital low pass filter circuit 170, and a control circuit 180.

The digital controlled oscillator circuit 110 generates a clock signal CK1 in response to a digital code NR and a digital code NF. In greater detail, the digital controlled oscillator circuit 110 adjusts the clock signal CK1 according to a control signal SC, in which the control signal SC is generated based on the digital code NR and the digital code NF. In some embodiments, the digital controlled oscillator circuit 110 may be implemented with delay circuits that are coupled in series (e.g., a ring oscillator), but the present disclosure is not limited thereto.

The clock generator circuitry 120 generates clock signals (e.g., CK2 in FIG. 3A) according to the clock signal CK1, and selects two clock signals (e.g., CK3 and CK4 in FIG. 3A) from these clock signals according to a selection signal SEL, in order to generate an output signal CKV. The TDC circuit 130 is coupled to the clock generator circuitry 120 to receive the output signal CKV, and is configured to detect a delay difference between the output signal CKV and a reference signal FREF (e.g., an interval TR and an interval TF in FIG. 2B), in order to generate the digital code NR and the digital code NF.

The logic control circuit 140 generates the selection signal SEL and a control word W2 according to the digital code NR and the digital code NE In some embodiments, the selection signal SEL is to reduce a duty cycle of the output signal CKV. In some embodiments, the logic control circuit 140 may be implemented with at least digital signal processor circuit having a computational ability, in order to perform related operations in FIG. 4.

The frequency tracking circuitry 150 generates a control word W1 according to one of the clock signals (e.g., CK2 in FIG. 3A) generated from the clock generator circuitry 120, in order to reduce a frequency error between the output signal CKV and the reference signal FREF. The one of the clock signals is referred to as "clock signal CK2-1" hereinafter. In some embodiments, the frequency tracking circuitry 150 includes a clock generator circuit 152, a counter circuit 154, and a flip-flop circuit 156. The clock generator circuit 152 is triggered according to the clock signal CK2-1, in order to generate a clock signal CKR according to the reference signal FREF. The counter circuit 154 is triggered according to the clock signal CK2-1, in order to generate a count value CV. The flip-flop circuit 156 is triggered according to the clock signal CKR, in order to output the count value CV to be the control word W1. The above arrangement of the frequency tracking circuitry 150 is given for illustrative purposes, and the present disclosure is not limited thereto.

The adder circuit 160 sums up the control word W1, the control word W2, and a frequency control word FCW, in order to generate a control word W3. The digital low pass filter circuit 170 is coupled to the adder circuit 160, in order to receive the control word W3, and to generate a control word CW according to the control word W3. The control circuit 180 is coupled to the digital low pass filter circuit 170, in order to receive the control word CW, and to output the control signal SC accordingly. With the above arrangement, a negative control mechanism of the digital controlled oscillator circuit 110 is implemented. In some embodiments, each of the adder circuit 160, the digital low pass filter circuit 170, and the control circuit 180 may be implemented with one or more digital logic circuits.

Figure 2A:
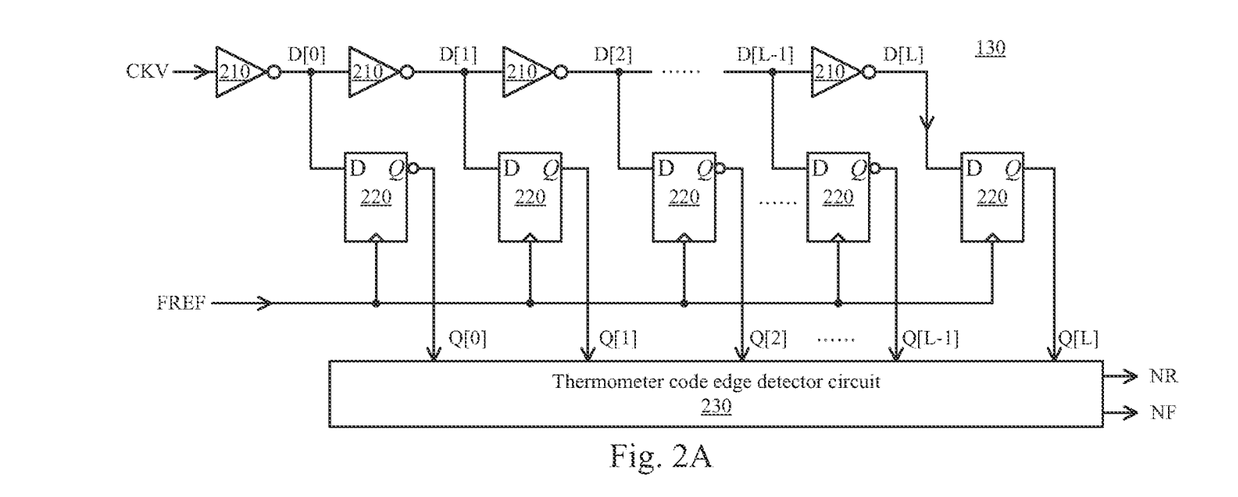
FIG. 2A is a schematic diagram of the time to digital converter (TDC) circuit in FIG. 1 according to some embodiments of the present disclosure.

FIG. 2A is a schematic diagram of the TDC circuit 130 in FIG. 1 according to some embodiments of the present disclosure. In this example, the TDC circuit 130 includes inverter circuits 210, D type flip-flop circuits 220, and a thermometer code edge detector circuit 230. The inverter circuits 210 are coupled in series, and sequentially output bits D[0]-D[L] according to the output signal CKV. The D type flip-flop circuits are trigged according to the reference signal FREF, in order to respectively generate bits Q[0]-Q[L] according to the bits D[0]-D[L]. Parts of the D type flip-flop circuits 220 (e.g., odd-numbered D type flip-flop circuits 220) are configured to have inverting output terminals. As a result, outputs of these D type flip-flop circuits 220 are the inverse of their inputs. For example, the bit Q[0] is the inverse of the bit D[0]. The thermometer code edge detector circuit 230 analyzes the delay difference between the reference signal FREF and the output signal CKV according to the bits Q[0]-Q[L], in order to output the digital code NR and the digital code NF.

Figure 2B:
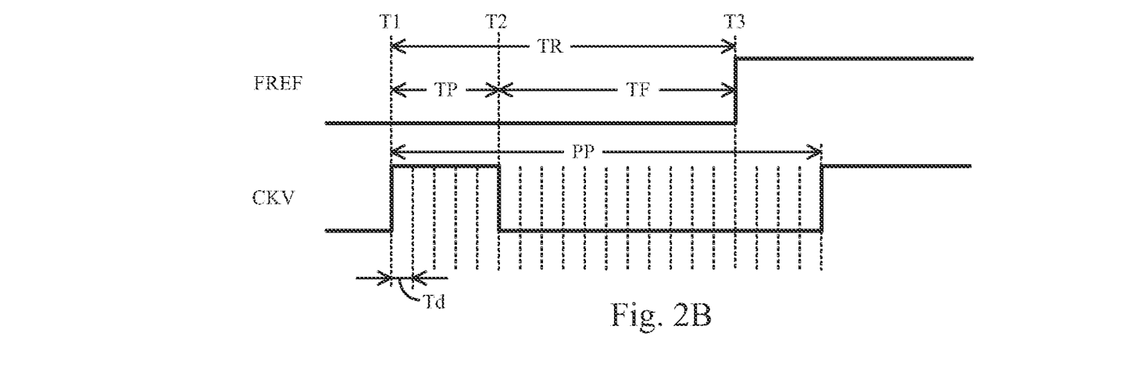
FIG. 2B is a schematic diagram showing operating concepts of the TDC circuit in FIG. 2A according to some embodiments of the present disclosure.

FIG. 2B is a schematic diagram showing operating concepts of the TDC circuit 130 in FIG. 2A according to some embodiments of the present disclosure. As shown in FIG. 2B, a rising edge of the output signal CKV is at time T1, a falling edge of the output signal CKV is at time T2, and a rising edge of the reference signal FREF is at time T3. An interval TR is between time T1 and time T3, an interval TF is between time T2 and time T3, and a difference between the interval TR and the interval TF is an interval TP. The interval TP is a duty cycle (e.g., an interval from the rising edge to the falling edge) of the output signal CKV.

At time T1, when the output signal CKV transits from a low level to a high level, the bits D[0]-D[L] are sequentially switched to logic values of 1 or logic values of 1. At time T2, when the output signal CKV transits from the high level to the low level, the bits D[0]-D[L] are sequentially switched to the logic values of 1 or the logic values of 0. At time T3, when the reference signal FREF transits from the low level to the high level, the D type flip-flop circuits 220 are trigged to output the bits D[0]-D[L] to be the bits Q[0]-Q[L]. On account of delays of the inverter circuits 210, in the above operation, parts of the bits Q[0]-Q[L] are logic values of 1, and other parts of the bits Q[0]-Q[L] are logic values of 0. By analyzing a distribution of the logic values of the bits Q[0]-Q[L], the interval TR and the interval TF can be detected, in order to determine the delay difference between the output signal CKV and the reference signal FREE For example, as shown in FIG. 2B, a period PP of the output signal CKV may be divided into fractional times Td, in which each fractional time Td corresponds to a delay of one inverter circuit 210. As a result, by analyzing the bits Q[0]-Q[L], a number of the fractional times Td corresponding to the interval TR and that corresponding to the interval TF can be known. In some embodiments, the thermometer code edge detector circuit 230 may analyze the bits Q[0]-Q[L], in order to generate the digital code NR corresponding to the interval TR and the digital code NF corresponding to the interval TF. As a result, the logic control circuit 140 may acquire information of the intervals TR and TN according to the digital code NR and digital code NF, and may generate the corresponding selection signal SEL.

Figure 3A:
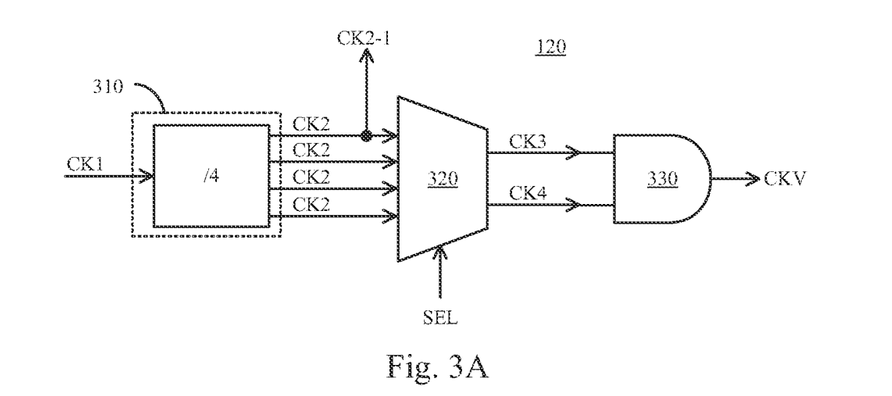
FIG. 3A is a schematic diagram of the clock generator circuitry in FIG. 1 according to some embodiments of the present disclosure.
Figure 3B:
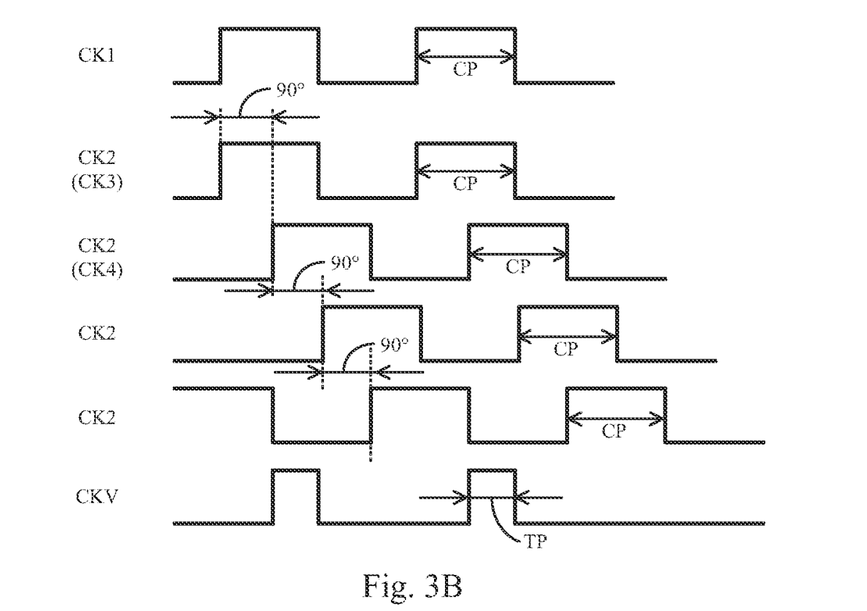
FIG. 3B is a schematic diagram of partial waveform(s) in FIG. 3A according to some embodiments of the present disclosure.

FIG. 3A is a schematic diagram of the clock generator circuitry 120 in FIG. 1 according to some embodiments of the present disclosure. The clock generator circuitry 120 includes a multi-phase generator circuit 310, a multiplexer circuit 320, and a logic gate circuit 330. The multi-phase generator circuit 310 generates clock signals CK2 according to the clock signal CK1, in which phases of the clock signals CK2 are different from each other. In this example, the multi-phase generator circuit 310 may be a quadrature-phase clock generator circuit that generates 4 clock signals CK2 according to the clock signal CK1, in which the clock signals CK2 are sequentially different in phase by about 90 degrees (as shown in FIG. 3B). In some embodiments, a duty cycle of the clock signal CK1 may be the same as a duty cycle CP of each of the clock signals CK2. In some embodiments, the multi-phase generator circuit 310 may be implemented with flip-flop circuit(s) and/or logic gate circuit(s).

The multiplexer circuit 320 selects a clock signal CK3 and a clock signal CK3 from the clock signals CK2 according to the selection signal SEL. The logic gate circuit 330 generates the output signal CKV according to the clock signal CK3 and the clock signal CK4. In some embodiments, the multiplexer circuit 320 may output different clock signals CK2 to be the clock signal CK3 and the clock signal CK4. In some embodiments, the multiplexer circuit 320 may output the same clock signal CK2 to be the clock signal CK3 and the clock signal CK4. Reference is made to FIG. 3B. FIG. 3B is a schematic diagram of partial waveform(s) in FIG. 3A according to some embodiments of the present disclosure. In this example, the logic gate circuit 330 may be an AND gate circuit. When both of the clock signals CK3 and CK4 are at a high level, the logic gate circuit 330 outputs the output signal CKV having the high level. Alternatively, when the clock signal CK3 or the clock signal CK4 is at a low level, the logic gate circuit 330 outputs the output signal CKV having the low level. The arrangement of the clock generator circuitry 120 is given for illustrative purposes, and the present disclosure is not limited thereto.

Figure 4:
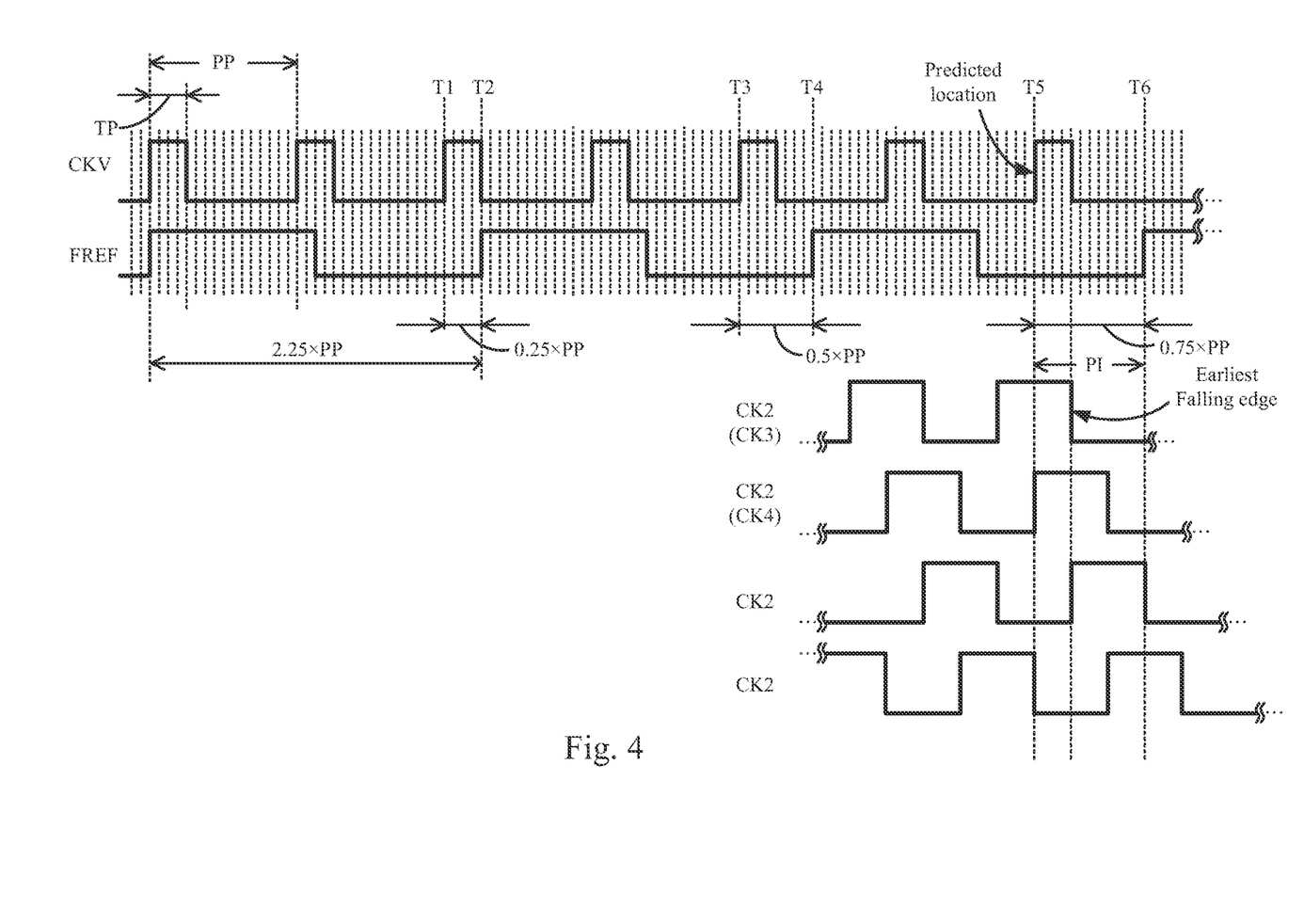
FIG. 4 is a schematic diagram of a waveform of the output signal and the reference signal in FIG. 1 according to some embodiments of the present disclosure.

In order to illustrate operation(s) of the logic control circuit 140, reference is now made to FIG. 4, and FIG. 4 is a schematic diagram of a waveform of the output signal CKV and the reference signal FREF in FIG. 1 according to some embodiments of the present disclosure. In this example, the duty cycle of the output signal CKV is 25%, and a period of the reference signal FREF is known. For example, the period of the reference signal FREF is set to be 2.25 times of the period PP of the output signal CKV. As a result, according to the digital code NR and the digital code NF, the logic control circuit 140 is able to predict a timing of a rising edge of the output signal CKV. For example, if the phase is correctly locked, according to the digital code NR and the digital code NF, the logic control circuit 140 detects that the rising edge, at time T1, of the output signal CKV and a rising edge, at time T2, of the reference signal FREF are different by 0.25 times of the period PP; the logic control circuit 140 detects that a rising edge, at time T3, of the output signal CKV and a rising edge, at time T4, of the reference signal FREF are different by 0.5 times of the period PP. By this analogy, the logic control circuit 140 is able to predict that a next rising edge (i.e., rising edge at time T5) of the output signal CKV will be at a location (hereinafter referred to as "predicted location") which is an interval of 0.75 times of the period PP away from a next rising edge (i.e., a rising edge at time T6) of the reference signal FREF. The above prediction is given for illustrative purposes, and the present disclosure is not limited thereto. In some embodiments, in the progress of the above prediction, the logic control circuit 140 is able to further consider a delay time caused by processing of circuits, in order to improve the accuracy of the prediction.

After the prediction location is acquired, the logic control circuit 140 is able to select a signal, which has an earliest falling edge during a predetermined interval PI, in the clock signals CK2 to be the clock signal CK3, in which the predetermined interval PI is an interval between the predicted location and the rising edge of the reference signal FREF. Afterwards, the logic control circuit 140 selects a signal, which has a phase next to the phase of the clock signal CK3, in the clock signals CK2 to be the clock signal CK4 As a result, the duty cycle (i.e., interval TP) of the output signal CKV can be less than the duty cycle CP of the clock signal CK1.

In some related approaches, a duty cycle of an output signal from a digital controlled oscillator circuit is set to be at least 50%. In these approaches, in order to lock the phase, a delay time of a TDC circuit is required to set to cover at least a half of the period of the output signal. As a result, a number of delay circuits (e.g., the inverter circuits 210 in FIG. 2A) in the TDC circuit will be vast, and thus hardware cost is significantly increased. Moreover, in these approaches, the delay circuits in the TDC circuit are set to operate with a frequency (which usually is several gigahertz) of the output signal from the digital controlled oscillator circuit, which results in a higher power consumption. Compared with the above approaches, with the clock generator circuitry 120, the output signal CKV having lower duty cycle can be generated based on the clock signal CK1. As a result, the number of delay circuits in the TDC circuit 130 can be reduced, in order to reduce the hardware cost and the power consumption.

In some embodiments, the logic control circuit 140 includes a normalization circuit (not shown) and a selection circuit (not shown). The normalization circuit generates the control word W2 according to the digital code NR and the digital code NF, and determines a number of the partial time(s) Td corresponding to the interval TR in FIG. 2B and a number of the partial time(s) Td corresponding to the interval TF in FIG. 2B. The selection circuit may determine the predicted location according to the above information generated from the normalization circuit, in order to generate the selection signal SEL for selecting the clock signal CK3 and the clock signal CK4.

Figure 5:
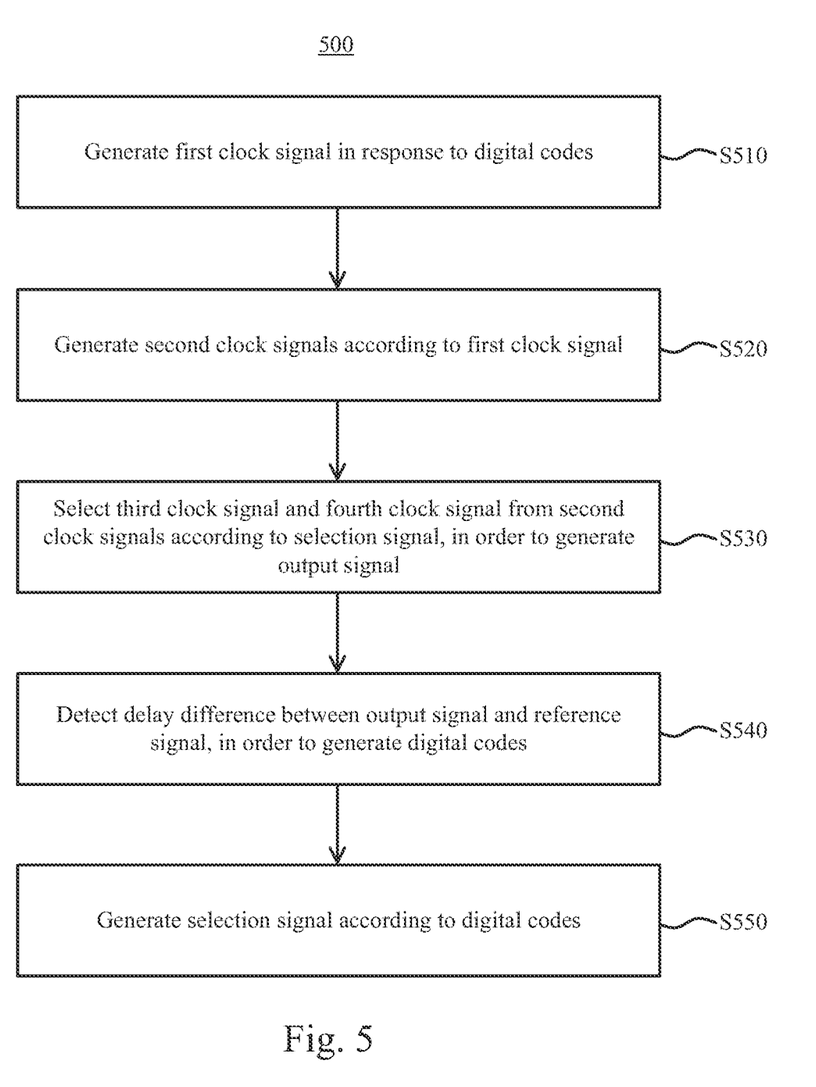
FIG. 5 is a flow chart of a clock generation method according to some embodiments of the present disclosure.

FIG. 5 is a flow chart of a clock generation method 500 according to some embodiments of the present disclosure. In operation S510, a first clock signal is generated in response to digital codes. In operation S520, second clock signals are generated according to the first clock signal. In operation S530, a third clock signal and a fourth clock signal are selected from the second clock signals according to a selection signal, in order to generate an output signal. In operation S540, a delay difference between the output signal and a reference signal is detected, in order to generate digital codes. In operation S550, the selection signal is generated according to the digital codes.

The above operations can be understood with reference to various embodiments discussed above, and thus the repetitious descriptions are not given. The above description of the clock generation method 500 includes exemplary operations, but the operations are not necessarily performed in the order described above. Operations of the clock generation method 500 may be added, replaced, changed order, and/or eliminated as appropriate, or the operations are able to be executed simultaneously or partially simultaneously as appropriate, in accordance with the spirit and scope of various embodiments of the present disclosure.

As described above, the phase locked loop device and the clock generation method provided in some embodiments of the present disclosure are able to reduce the duty cycle of the output signal from the digital controlled oscillator circuit, in order to reduce a timing required to be covered by the TDC circuit. As a result, the hardware cost and the power consumption can be reduced.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A phase locked device, comprising:
   a digital controlled oscillator circuit configured to generate a first clock signal in response to a plurality of digital codes;
   a clock signal generator circuitry configured to generate a plurality of second clock signals according to the first clock signal, and to select a third clock signal and a fourth clock signal from the plurality of second clock signals according to a selection signal, in order to generate an output signal;
   a time to digital converter circuit configured to detect a delay difference between the output signal and a reference signal, in order to generate the plurality of digital codes; and
   a logic control circuit configured to generate the selection signal according to the plurality of digital codes.

2. The phase locked device of claim 1, wherein the clock generator circuitry comprises:
   a multi-phase generator circuit configured to generate the plurality of second clock signals according to the first clock signal;
   a multiplexer circuit configured to select the third clock signal and the fourth clock signal from the plurality of second clock signals according to the selection signal; and
   a logic gate circuit configured to generate the output signal according to the third clock signal and the fourth clock signal.

3. The phase locked device of claim 2, wherein the multi-phase generator circuit is a quadrature-phase clock generator circuit, and the plurality of second clock signals are sequentially different in phase by 90 degrees.

4. The phase locked device of claim 2, wherein the logic gate circuit is an AND gate circuit.

5. The phase locked device of claim 1, wherein a duty cycle of the output signal is less than a duty cycle of the first clock signal.

6. The phase locked loop device of claim 1, wherein the time to digital converter circuit is configured to detect an interval between a rising edge of the output signal and a rising edge of the reference signal, in order to generate a first digital code of the plurality of digital codes, and to detect an interval between a falling edge of the output signal and the rising edge of the reference signal, in order to generate a second digital code of the plurality of digital codes.

7. The phase locked loop device of claim 1, wherein the logic control circuit is configured to predict a first rising edge of the output signal according to the plurality of digital codes, in order to select a signal having an earliest falling edge during a predetermined interval from the plurality of second clock signals to be the third clock signal, and the predetermined interval is an interval between the first rising edge and a rising edge of the reference signal.

8. The phase locked loop device of claim 1, wherein the logic control circuit is further configured to select a signal having a phase next to a phase of the third clock signal from the plurality of second clock signals to be the fourth clock signal.

9. A clock generation method, comprising:
   generating a first clock signal in response to a plurality of digital codes;
   generating a plurality of second clock signals according to the first clock signal;
   selecting a third clock signal and a fourth clock signal from the plurality of second clock signals according to a selection signal, in order to generate an output signal;
   detecting a delay difference between the output signal and a reference signal, in order to generate the plurality of digital codes; and
   generating the selection signal according to the plurality of digital codes.

10. The clock generation method of claim 9, wherein selecting the third clock signal and the fourth clock signal from the plurality of second clock signals according to the selection signal, in order to generate the output signal comprises:
    predicting a first rising edge of the output signal according to the plurality of digital codes; and
    selecting a signal having an earliest falling edge during a predetermined interval from the plurality of second clock signals to be the third clock signal, wherein the predetermined interval is an interval between the first rising edge and a rising edge of the reference signal.

11. The clock generation method of claim 9, wherein selecting the third clock signal and the fourth clock signal from the plurality of second clock signals according to the selection signal, in order to generate the output signal comprises:
    selecting a signal having a phase next to a phase of the third clock signal from the plurality of second clock signals to be the fourth clock signal.

12. The clock generation method of claim 9, wherein generating the plurality of second clock signals according to the first clock signal comprises:
    generating, by a multi-phase generator circuit, the plurality of second clock signals according to the first clock signal.

13. The clock generation method of claim 12, wherein the multi-phase generator circuit is a quadrature-phase clock generator circuit, and the plurality of second clock signals are sequentially different in phase by 90 degrees.

14. The clock generation method of claim 9, wherein selecting the third clock signal and the fourth clock signal from the plurality of second clock signals according to the selection signal, in order to generate the output signal comprises:
    generating, by a logic gate circuit, the output signal according to the third clock signal and the fourth clock signal.

15. The clock generation method of claim 14, wherein the logic gate circuit is an AND gate circuit.

16. The clock generation method of claim 9, wherein detecting the delay difference between the output signal and the reference signal, in order to generate the plurality of digital codes comprises:
- detecting an interval between a rising edge of the output signal and a rising edge of the reference signal, in order to generate a first digital code of the plurality of digital codes; and
- detecting an interval between a falling edge of the output signal and the rising edge of the reference signal, in order to generate a second digital code of the plurality of digital codes.

17. The clock generation method of claim 9, wherein a duty cycle of the output signal is less than a duty cycle of the first clock signal.

* * * * *